United States Patent
Ledzius et al.

(10) Patent No.: US 8,362,936 B2
(45) Date of Patent: Jan. 29, 2013

(54) CIRCUIT AND METHOD FOR OPTIMIZING DYNAMIC RANGE IN A DIGITAL TO ANALOG SIGNAL PATH

(75) Inventors: Robert Ledzius, Round Rock, TX (US); Matt Felder, Austin, TX (US)

(73) Assignee: Maxim Integrated Products, Inc., San Jose, CA (US)

( * ) Notice: Subject to any disclaimer, the term of this patent is extended or adjusted under 35 U.S.C. 154(b) by 150 days.

(21) Appl. No.: 13/011,784

(22) Filed: Jan. 21, 2011

(65) Prior Publication Data

US 2012/0188111 A1    Jul. 26, 2012

(51) Int. Cl.
*H03M 1/66* (2006.01)

(52) U.S. Cl. ........................................ 341/139; 341/144

(58) Field of Classification Search .................. 341/144, 341/155, 118, 120, 141
See application file for complete search history.

(56) References Cited

U.S. PATENT DOCUMENTS

| | | | | |
|---|---|---|---|---|
| 6,381,570 | B2 * | 4/2002 | Li et al. | 704/233 |
| 6,956,919 | B2 * | 10/2005 | Amar et al. | 375/355 |
| 7,215,202 | B2 * | 5/2007 | Al-Shyoukh et al. | 330/279 |
| 7,468,687 | B2 * | 12/2008 | Nozawa et al. | 341/144 |
| 7,659,707 | B2 * | 2/2010 | Eken et al. | 324/76.11 |

\* cited by examiner

*Primary Examiner* — Joseph Lauture

(57) ABSTRACT

A circuit for maximizing dynamic range in a digital to analog signal path comprises an input for receiving an input signal, a first gain stage coupled to the input having a first gain setting, an second gain stage coupled to the first gain stage, the second gain stage having an second gain setting, a controller configured to selectively increase the first gain setting and decrease the second gain setting according to the input signal level and an output coupled to the second gain stage for transmitting an output signal. A method for maximizing dynamic range in a digital to analog signal path comprises detecting a digital input signal level, detecting a desired user gain level, applying a first gain to the digital input signal, converting the digital input signal into an analog signal, and applying a second gain to the analog signal, wherein the first and second gain are selectively and inversely manipulated according to the digital input signal while maintaining a desired user gain level.

22 Claims, 5 Drawing Sheets

CIRCUIT AND METHOD FOR OPTIMIZING DYNAMIC RANGE IN A DIGITAL TO ANALOG SIGNAL PATH

FIELD OF THE INVENTION

The present invention relates to the field of integrated circuits. More specifically, it relates to integrated circuits having a digital to analog signal path.

BACKGROUND OF THE INVENTION

Dynamic Range is an important metric in an integrated circuit or a system having a digital to analog signal path. One example of such a circuit or system is a digital audio playback device, such as an mp3 player, CD player, or mobile phone. Such playback devices have means, described below, for transforming digitally stored or transmitted data into a usable analog signal. Dynamic range (DR) is the ratio between the smallest and largest possible values of a changeable quantity, such as audio signal amplitude. DR is typically measured as a ratio, such as a base-10 (decibel) or base-2 (doublings, bits or stops) logarithmic value. In most electrical systems, including digital audio playback, the decibel measure is standard. For example, the 16-bit compact disc has a theoretical dynamic range of about 96 dB. Digital audio with 20-bit digitization is capable of approximately 120 dB DR; similarly, 24-bit digital audio calculates to approximately 144 dB DR. In audio playback systems, it is common practice to measure DR as total harmonic distortion plus noise (THD+N) relative to full scale with a −60 dB input signal. Furthermore, the approximate theoretical maximum DR values are sometimes calculated relative to a full Nyquist frequency bandwidth measurement. In some measurement techniques, measured bandwidths are reduced from the Nyquist rate to an audible bandwidth resulting in an increase in the reported dynamic range value. Also, the frequency spectrum of the measured output can be altered using industry accepted filters that may alter the DR value. For example, some measurement techniques filter an output through an A-weighted filter that approximates the perceptive response of the human ear.

Conventionally, digital audio recording and playback chains include input and output converters and associated analog circuitry, which may result in significantly limiting practical DR below the theoretical optimum. Observed 16-bit digital audio DR can be noticeably lower, even 90 dB or below, when multiple circuits in the audio path individually contribute integrated noise at the −96 dB level. A DR measurement is a useful indication of signal quality when the desired signal level is low. In an audio example, soft music or low volume music can suffer from the effects of poor DR more than loud music.

FIG. 1 shows such a prior art digital to analog signal path 100 that may have limited DR performance. Digital input data 110 is coupled to a digital gain block 120. Digital input data 110 can be a digital transmission received by an antenna, stored digital data in a memory, or any other digital input source. It is important to note that the digital source need not be limited to audio data, but can be any type of quantized or digital information. In practice, the digital input data 110 is modeled as a combination of the digital input data 110 and the inherent quantization noise 112 due to the quantized nature of the signal. In FIG. 1, the quantization noise 112 is shown summed with the digital input data 110 but it is important to note that no physical summer 115 exists. Rather, the summer 115 merely represents the addition of unavoidable quantization noise 112. The digital gain 120 controls the gain of the overall signal while it is still in a digital state. Typical signal sources for providing digital input data 110 can be via a de-serialized Inter-IC Sound (I2S) bus, SPDIF de-framed signal source, or time domain recovered signal from a compressed MP3 formatted source. The source data is typically interpolated to improve the transient signal quality. The digital gain 120 controls the gain of the overall signal while it is still in a digital state, typically through manipulation using a common digital multiplier. Excessive digital gain can cause overflow in the digital code, which would typically be clip limited, and will undesirably degrade large amplitude signals.

The gained or attenuated digital signal from digital gain block 120 is then passed to a digital to analog (DAC) 130 for conversion to an analog signal. Every DAC effectively injects additional noise into the signal, which can be input referred or output referred depending on convenience and convention. In FIG. 1, DAC input referred noise 122 is shown summed with the output of the digital gain 120. Again, no physical summer 125 exists but rather serves to represent that noise is being injected into the signal path. The output of the DAC 130 is coupled with a driver and analog gain 140, which also has some input referred noise 132. The summer 135 merely represents that even more noise is being injected into the system. It is important to note that not all prior art includes both a digital gain 120 and analog gain control 140. Some systems may include simply one or the other, or neither. It is further important to note that the signal path 100 is highly simplified, and many other components as required by specific applications can be placed along the signal path 100. For example, analog mixers are often placed between the DAC 130 and the driver and analog gain 140, and each additional component will necessarily add noise to the system. The overall gain of the signal path is controlled by a gain control 150, which may control both the digital gain 120 and the analog gain 140. The gain control 150 is controlled in turn by a user control 152. An important distinction should be made between the user of the integrated circuit and the user of an end product. The user of the integrated circuit in which this signal path can be found (for example, an audio codec or processor) is most likely a manufacturer of audio appliances, such as Apple® in making their widely popular iPod®, or any other conceivable manufacturer. Such a user designs a system in which an end user, or the user of the iPod®, for example, is able to manipulate volume as desired. In general, the manufacturer's system enables the end user to manipulate one or both of the gains with a single control input. Generally, an end user cannot manipulate the digital gain 120 and the driver and analog gain 140 separately, because end users prefer a single gain control for simplicity and convenience. When an end user manipulates the volume control on their audio device, the gain control 150 as designed by the manufacturer simply adds gain in the digital realm with the digital gain 120 and/or the analog realm with the audio gain 140. However, such a system does nothing to improve dynamic range, especially in low level signals. In the prior art solutions the noise contributions of the multiple modules in the signal path require better noise performance from each of the modules. However, greater quality and lower noise modules require greater die size and more current. Die size is the greatest component of cost in an integrated circuit, and increased current is undesirable to manufacturers of portable electronics who are concerned with battery life. Furthermore, the integrated circuit industry as a whole is extremely cost driven, and increased cost associated with larger die sizes is undesirable.

SUMMARY OF THE INVENTION

What is provided is a novel circuit and method for increasing DR without substantially increasing power consumed or die size. A digital signal level detector determines when the digital gain should be adjusted to maximize the digital gain for lower amplitude input signals while avoiding the clipped state mentioned above, which leads to severe signal degradation when large amplitude input signals are being converted. In addition to the digital signal level detector, a dynamic gain controller which automatically adjusts the gain settings of an analog gain and a digital gain with respect to each other is introduced. The dynamic gain controller selectively minimizes the analog gain, and thereby minimizes the associated noise for all blocks in the signal path, while maximizing the digital gain, so that the overall gain as set by an end user is not affected.

In one aspect of the invention, a circuit for maximizing dynamic range in a digital to analog signal path comprises an input for receiving an input signal; a first gain stage coupled to the input, the first gain stage having a first gain setting; a second gain stage coupled to the first gain stage, the second gain stage having a second gain setting; a controller to dynamically select the first gain setting to maximize the first gain setting without clipping the input signal and to select the second gain setting to achieve a desired signal path gain; and an output coupled to the second gain stage for transmitting an output signal having the desired overall signal path gain. Preferably, the first gain stage comprises a digital gain stage, and the first gain setting comprises a digital gain setting for use by a multiply gain stage. In some embodiments, the first gain stage comprises a digital-analog converter, and the digital gain setting comprises a feedback change in the digital-analog converter. Also, the second gain stage comprises an analog gain stage, and the second gain setting comprises an analog gain setting. The analog gain can be implemented in any number of known, convenient or application specific ways, such as discrete gain steps or an analog adjusted gain.

The circuit for maximizing dynamic range in a digital to analog signal path also comprises an input signal detector for detecting a level of the input signal. The input signal detector can be any convenient or application specific detector, such as an RMS level detector, a peak level detector, a clip detector, an average level detector, or the like. The circuit further comprises a user gain setting coupled to the controller. The user gain will determine the signal path gain which is the summation of the first and second gains. The dynamic gain controller will maximize the digital gain and minimize the analog gain within the constraints of the signal path gain set by the user and avoiding signal clipping in the first gain stage. In some embodiments, the controller will delay application of the second gain setting relative to application of the first gain setting to compensate for signal path delays between the first gain stage and the second gain stage. The controller will adjust the first gain setting and the second gain setting only if an input signal level is beneath a specified threshold value for a specified period of time.

In another aspect of the invention, a method for maximizing dynamic range in a digital to analog signal path comprises detecting a digital input signal and a desired user gain level, applying a first gain to the digital input signal, converting the digital input signal into an analog signal, and applying a second gain to the analog signal, wherein the first and second gain are selectively and inversely manipulated according to the digital input signal while maintaining the desired user gain level. Preferably, applying a first gain to the digital input signal can be done with sufficiently small incremental changes that instantaneous changes are not perceptible to the listener. In other embodiments, the method includes detection of a zero cross in the digital signal such that the gain levels are adjusted when the signal is very small to minimize signal path disturbances caused by the gain changes. The second gain may be adjusted based on the digital zero cross detect or an analog zero cross detect circuit. In some embodiments, applying a first gain comprises changing a gain setting of a feedback loop in a digital to analog converter. Dynamic volume control may include attack, decay, and hold controls to minimize the perceptibility of gain change behavior.

DETAILED DESCRIPTION OF THE DRAWINGS

Reference will now be made in detail to the embodiments of a dynamic range optimization method and apparatus of the invention, examples of which are illustrated in the accompanying drawings. While the invention will be described in conjunction with the embodiments below, it will be understood that they are not intended to limit the invention to these embodiments and examples. On the contrary, the invention is intended to cover alternatives, modifications and equivalents, which may be included within the spirit and scope of the invention as defined by the appended claims. Furthermore, in the following detailed description of the present invention, numerous specific details are set forth in order to more fully illustrate the present invention. However, it will be apparent to one of ordinary skill in the prior art that the present invention may be practiced without these specific details. In other instances, well-known methods and procedures, components and processes haven not been described in detail so as not to unnecessarily obscure aspects of the present invention. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
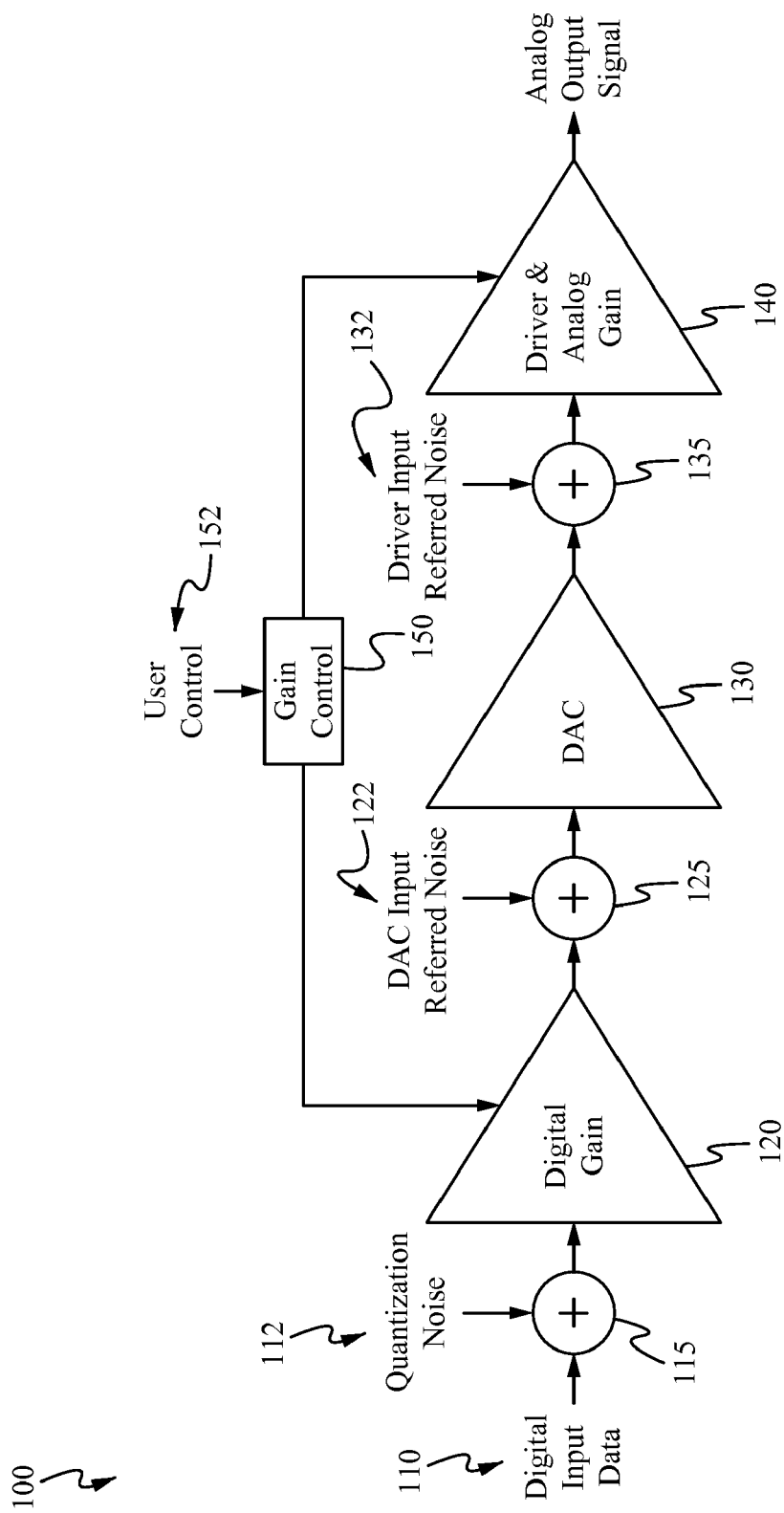
FIG. 1 shows a prior art digital to analog signal path.
Figure 2:
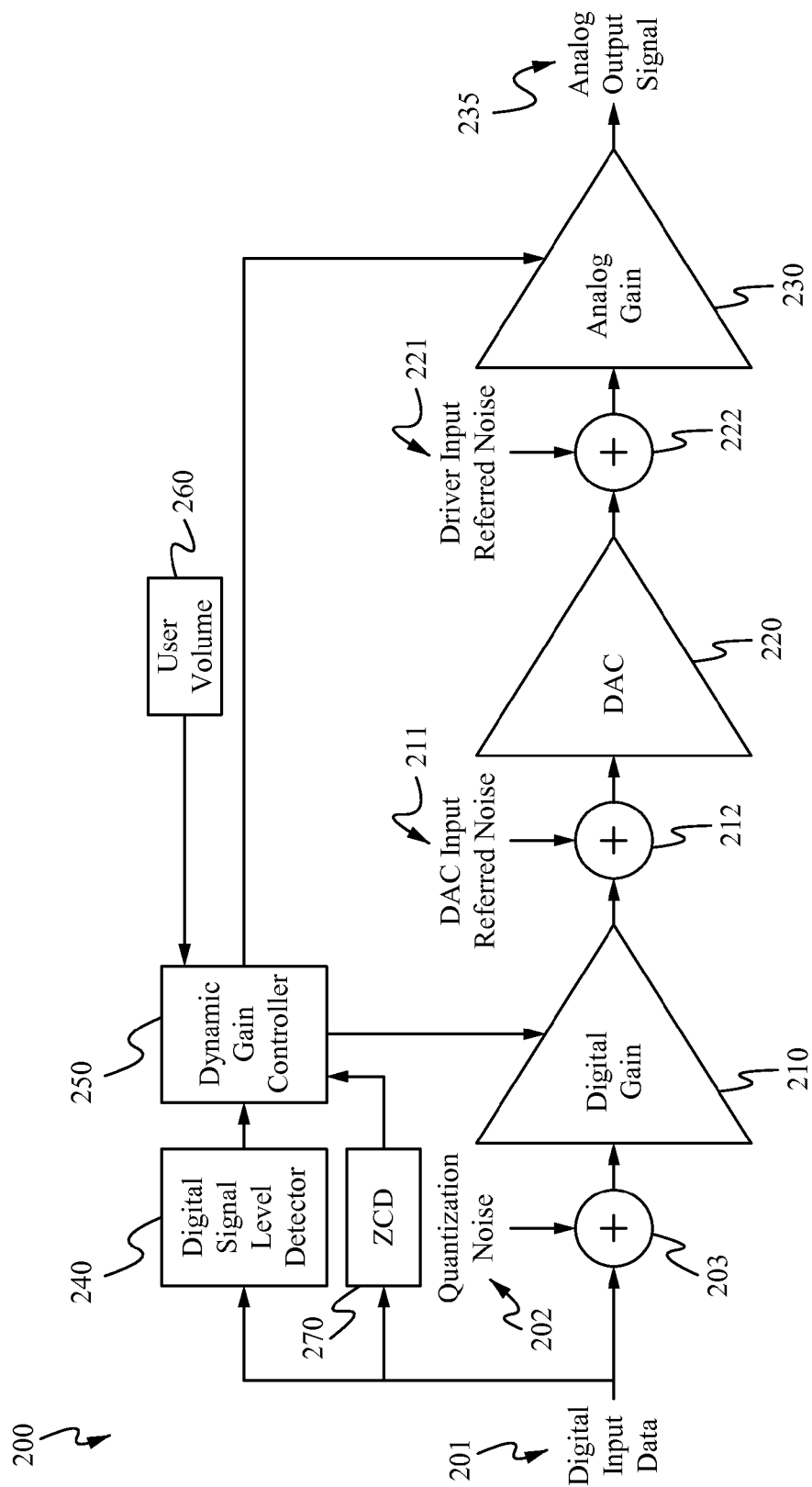
FIG. 2 shows a digital to analog signal path per an embodiment of this disclosure.

FIG. 2 shows a digital to analog signal path 200 per an embodiment of this disclosure. Digital input data 201 is coupled to a first gain. In this embodiment, the first gain comprises a digital gain 210. The digital input data 201 can originate from memory, through an antenna, a wire bound connection, or any other means. The digital input data 201 can be sourced, for example, from I2S encoded data, AC97 encoded data, SPDIF encoded data, or any other known or application specific digital encoding scheme. Quantization noise 202 is represented as being injected into the signal path 200 through a summer 203. The summer 203 is merely a representation of inherent quantization noise 202 and is not physically embodied as a module within the signal path 200. The digital gain 210 is able to manipulate the signal level of the digital input data 201. As mentioned above, adding gain to digital input data 201 does not involve merely electrically amplifying a digital signal. Rather, the actual digital representation of the signal is digitally manipulated. One means to achieve a digital gain change is a digital multiplier function within the digital gain 210. Setting a gain within the digital gain 210 that is too high can cause either overflow or clipping both of which are undesirable. It is important to note that applying digital gain 210 is dynamic, and therefore is distinct from volume control that happens to be digital, such as I2C gain control that merely controls a signal path gain through a digital interface, such as an up/down switch. The output of the digital gain 210 is coupled to a DAC 220.

As mentioned above, every DAC introduces noise, which can be input referred or output referred depending upon convention. In FIG. 2, the DAC noise is represented as DAC input referred noise 211 injected into the signal path 200 through a summer 212. Similarly, no physical summer 212 exists, but is shown to represent the injection of the DAC input referred noise 211. The DAC 220 can be any known or application specific DAC, such as a pulse width modulator, a sigma delta modulator, Nyquist, binary weighted, R-2R ladder, thermometer coded, or any other DAC. The DAC 220 converts the gained digital input data from the digital gain module 210 into an analog signal. The level of the DAC 220 analog output signal is determined by a combination of the gained digital input data level and the conversion gain of the DAC 220. It is important to note that the input referred quantization noise 202 and the DAC input referred noise 211 do not depend on the gain of the digital input data 201. Rather, they are determined by the quantization level or bit depth of the digital input data 201 and the quality of the DAC respectively. The output of the DAC 220 is coupled with the input of a second gain stage.

In the embodiment shown, the second gain stage is an analog gain 230. The analog gain 230 noise contribution is represented as driver input referred noise 221 injected through a summer 222. In general, the analog gain 230 is an amplifier or driver optimized for the audio band of analog signals, between 20 Hz and 20 KHz, and a volume control, such as an I2C control line or a volume control pin. Regardless of the type of driver used, as the gain setting of the analog gain 230 is increased, the noise in the analog output signal 235 increases since all the noise contributions (i.e. quantization noise 203, DAC input referred noise 212, and driver input referred noise 221) increase as the gain of the analog gain 230 is increased. Therefore, it is desirable to maximize the signal size early in the signal path to allow lower gain at the end of the signal path.

To that end, a dynamic gain controller 250 is introduced. The dynamic gain controller 250 maximizes the digital gain 210 without clipping the digital signal and minimizes the analog gain 230 while maintaining the overall desired gain of the signal path. The digital gain 210 is maximized and the analog gain 230 is minimized in the sense that a largest value for the digital gain level and a smallest value for the analog gain level are used to achieve the overall desired gain while still providing headroom to avoid clipping. As used herein, the terms "maximizing" and "minimizing" are applied to the digital gain and to the analog gain, respectively, in this context. The analog gain level is determined once the digital gain level is maximized for a given overall signal path desired gain.

Generally, the desired volume is set by a user through a user volume interface 260. In order to aid the dynamic gain controller 250 in determining the optimum gain settings for the digital gain 210 and the analog gain 230, a digital signal level detector 240 is provided. The digital signal level detector 240 receives the digital input data 201 and determines the level in any convenient way, such as detecting a peak level, RMS level, an average level, or any other known or application specific metric. The digital signal level detector 240 is coupled to the dynamic gain controller 250 and transmits a detected level to the dynamic gain controller 250. As mentioned above, it is highly undesirable to increase the gain setting in the digital gain 210 such that the encoded data overflows or clips thereby greatly distorting the signal. The dynamic gain controller 250 is configured to receive the level of the digital input data 201 from the digital signal level detector 240 so that when it dynamically determines a gain setting for the digital gain 210, the gain setting will not cause the digitally encoded information to overflow or clip. As the gain setting of the digital gain 210 is increased, the gain setting of the analog gain is decreased. Because the analog gain is decreased, the input referred noise 221 and the input referred noise 211 do not experience as much gain. Therefore, low level signals are recreated with much greater fidelity. As a result, the DR of the signal path 200 is improved. In prior art solutions, proper re-creation of low level signals required either greater current or greater die size in the analog gain 230 and/or the DAC 220.

Preferably, the dynamic gain controller 250 also receives a user gain setting from a user volume control 260. The user volume control 260 can be, for example, the volume toggle on an mp3 player having the digital to analog signal path 200. In an alternate embodiment, the user volume control 260 can be a volume control pin that is assigned and fixed for a given implementation. The dynamic gain controller 250 is configured to again minimize the gain setting of the analog gain 230 and maximize the gain setting of the digital gain 210 while maintaining the desired overall output volume set by the user through the user volume setting 260. Changing a gain setting introduces a step response into a system, such as the digital to analog signal path 200. A step response can cascade through the signal path 200, causing an audible pop or click. To minimize the pop or click caused by a change in gain, it is desirable to change the gain settings of the digital gain 210 and the analog gain 230 when the digital input signal 201 is near its minimum, such as when the instant amplitude of the signal is zero. To that end, a zero cross detect 270 is provided. In some embodiments, the dynamic gain controller 250 updates the gain levels only when the zero cross detect 270 detects a zero crossing, meaning that the instant amplitude of the signal is at or near zero. Advantageously, this reduces the potential pop or click generally associated with volume control, especially when digital input data 201 is oversampled at a higher rate to ensure digital data samples exist that are close to the zero crossing point.

In some embodiments, the analog gain (second gain) adjustment is made at a fixed time delay after the digital gain (first gain) adjustment to reduce disturbances caused by the signal path delay between the first and second gain stage blocks. This delay is implemented by the dynamic gain controller 250.

In some embodiments, the dynamic gain controller 250 includes attack and release controls such that the digital gain is not increased unless the detected signal level is beneath a specified threshold for a period of time defined by the "attack" control setting. Comparably the digital volume adjustments would not be decreased unless the detected signal level was above another specified threshold for a period of time defined by the "release" control setting.

Figure 3:
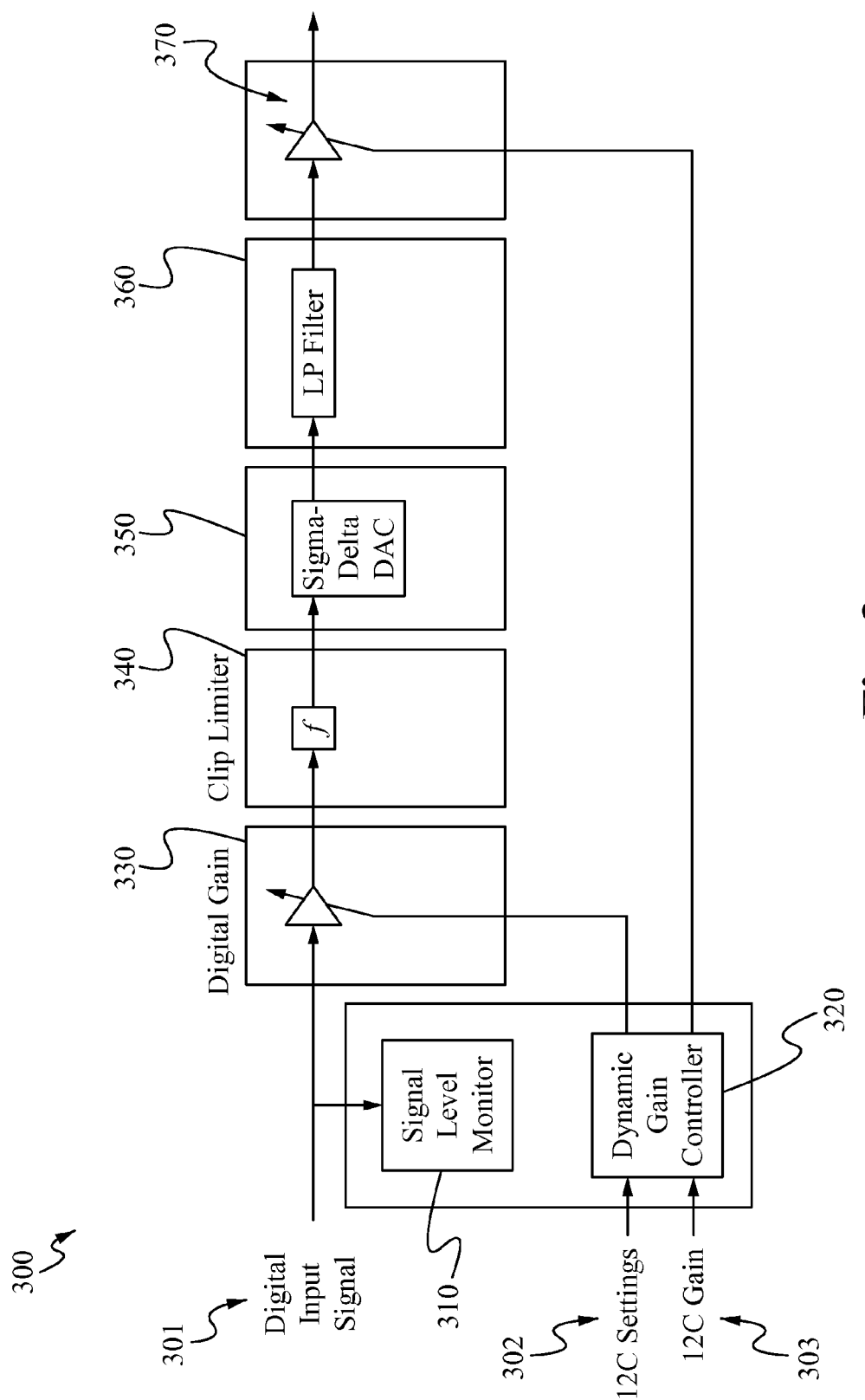
FIG. 3 shows a digital to analog signal path per another embodiment of this disclosure.

FIG. 3 shows an alternative embodiment digital to analog signal path 300 to the signal path of FIG. 2. A digital input signal 301 is received by a digital gain 330 and a signal level monitor 310. By way of example, the digital gain 330 is a multiplier logic block. The signal level monitor 310 can be any convenient or application specific level detector as discussed in detail above. The dynamic gain controller 320 receives I2C settings 302 and I2C gain 303. The I2C settings 302 are generally set or hardwired when the signal path 300 is designed into an appliance, such as an mp3 player. The I2C settings 302 may include the size of the gain steps, adjustable delay between the two gain control adjustments, adjustments to the time period/delay for level detection dynamic gain adjustment, and/or a zero cross detect enable so that gain changes are only made when the signal amplitude is zero to avoid click and pop. The I2C gain 303 is generally controlled by the end user of the appliance to set a desired gain or gain level. The dynamic gain controller 320 controls the gain of the digital gain 330 and the gain of the analog gain 370. As discussed in detail above, the dynamic gain controller 320 automatically maximizes the gain of the digital gain 330 so that a later analog gain can be minimal while also avoiding clipping or overflow in the digital signal. Although I2C control is generally referenced herein, the person of ordinary skill having the benefit of this disclosure will readily appreciate that a great number of ways of controlling a gain setting are available, including but not limited to analog gain control, hardwired gain steps, or the like. For the sake of brevity and clarity, I2C is discussed herein as it is an industry wide accepted standard of control.

As discussed above, manipulation of the digital gain 330 is a digital process performed by logic circuitry, such as a digital multiplier or shift and accumulate registers. The digital gain 330 is coupled to a Sigma-Delta DAC ($\Sigma\Delta$) 350. Oversampling DACs or interpolating DACs such as the $\Sigma\Delta$ 350 have several advantages. $\Sigma\Delta$ DACs use a noise shaped pulse density conversion technique. The oversampling technique allows for the use of a lower resolution DAC internally. A simple 1-bit DAC is often chosen because the oversampled result is inherently linear. The digital modulator includes feedback and filtering to push most of the large 1-bit quantization noise out of the audio band. This results in an effective high-pass filter acting on the 1-bit quantization noise caused by the Sigma-Delta DAC ($\Sigma\Delta$) 350, thus steering this noise out of the low frequencies of interest into the high frequencies of little interest, which is called noise shaping. The quantization noise at these high frequencies are removed or greatly attenuated by an analog low-pass filter 360. Some embodiments of $\Sigma\Delta$ DAC 350 include a low-pass filter function as part of the $\Sigma\Delta$ DAC 350 block rather than a separate/distinct block 360. Other embodiments have no specific low-pass filter if the application is not sensitive to the large out of band noise. Most high resolution, or greater than 14 bit DACs, are of this type due to its high linearity and low cost. Higher oversampling rates can relax the specifications of the output low-pass filter and/or enable further suppression of in-band quantization noise.

In some embodiments, multiple higher order topologies (such as MASH) can be used to achieve higher degrees of noise-shaping with a stable topology. The person of ordinary skill having the benefit of this disclosure will be very familiar with the great variety of DACs available, and for the sake of brevity and clarity detailed operation of other types of DACs are left out of this disclosure. The low-pass filter 360 is coupled to the analog gain 370, which is also manipulated by the dynamic gain control 320. As described in detail above, it is advantageous for the gain of the analog gain 370 to be the lowest possible while maintaining the user gain set by the I2C gain 303.

Figure 4:
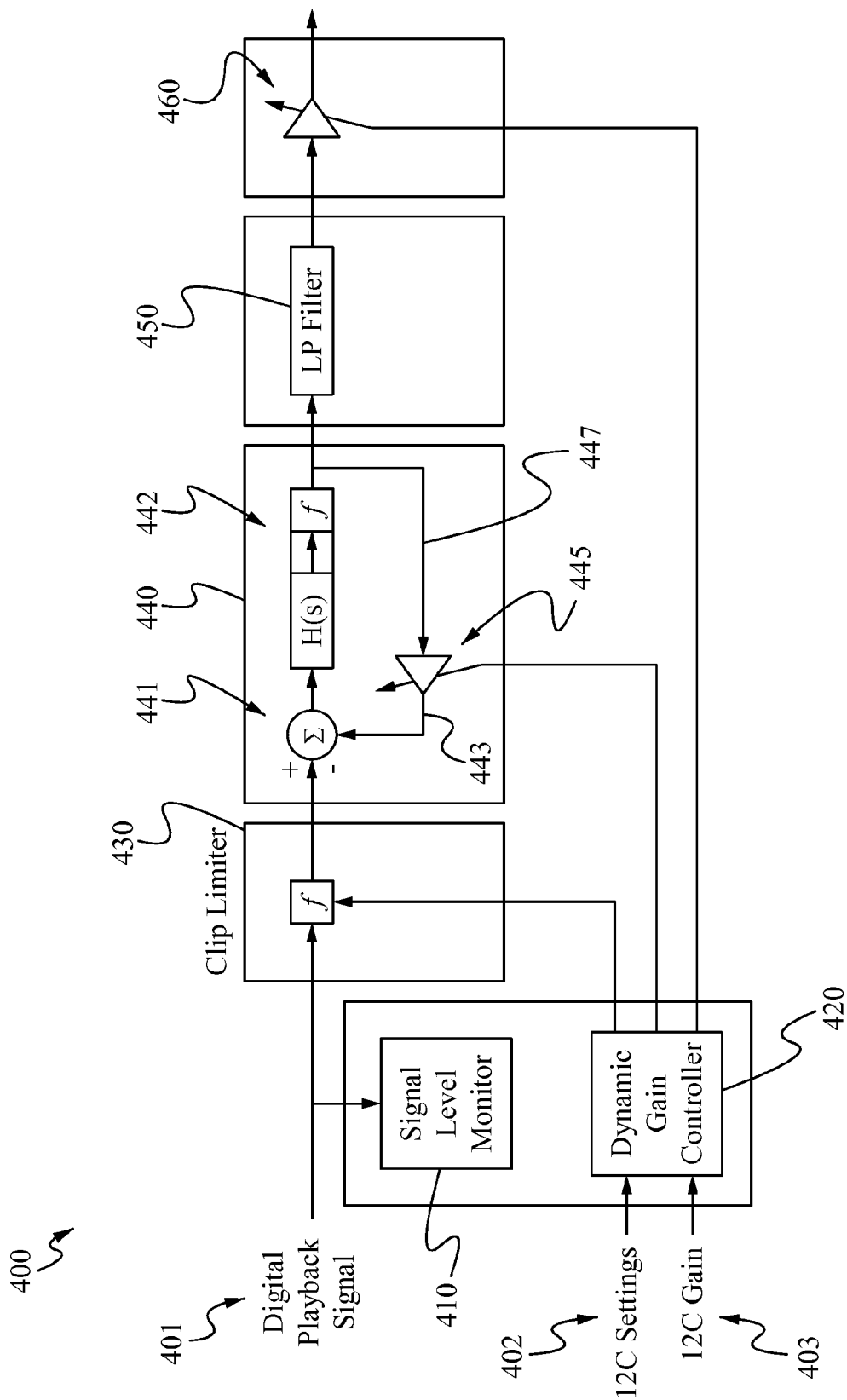
FIG. 4 shows a digital to analog signal path per another embodiment of this disclosure.

FIG. 4 shows an alternative digital to analog signal path 400 having a $\Sigma\Delta$ DAC 440, wherein the $\Sigma\Delta$ DAC 440 is shown in greater detail. A digital playback signal 401 is received by a clip limiter 430 and a signal level detector 410, each of which serve similar functions as described in FIG. 3 and need not be addressed in detail again. A $\Sigma\Delta$ DAC 440 receives the digital playback signal 401 that has been clip-limited by the clip limiter 430. The $\Sigma\Delta$ DAC 440 comprises an input summer 441 that sums the input along with the output of a transfer function 442 that is being fed back through a feedback path 447. In some embodiments, the transfer function is comprised of integrators and a comparator. The feedback path comprises a gain 445. Generally, the gain 445 converts the 1 bit DAC output 447 to a scaled multiple bit output 443. By reducing the feedback gain 445, the result of the summer 441 is affected, and the digital output gain of the $\Sigma\Delta$ DAC 440 is increased. Additionally, the amplitude shaped noise of the $\Sigma\Delta$ DAC 440 output relative to the input signal level is reduced. This results being able to achieve a higher DR from a lower order $\Sigma\Delta$ DAC modulator. Clip limiter 430 clip level is dynamically controlled to ensure that the signal introduced into $\Sigma\Delta$ DAC 440 does not exceed the appropriate maximum input level as determined by the feedback gain 445. Preferably, any change to the gain 445 is done gradually, for example by an up/down counter to avoid any instantaneous step effects that may have adverse signal quality ramifications such as causing the digital gain setting to wrap around to a minimum setting. As stated, the embodiment shown in FIG. 4 also advantageously contributes to noise shaping. As is well known, the shape, or spectral density, of the noise in the $\Sigma\Delta$ DAC 440 is dependent upon the loop gain, and as a result can be controlled to a desired level or pushed into the high frequency by changing the gain 445. The output of the $\Sigma\Delta$ DAC 440 is filtered by a filter 450. The analog gain 460 is similarly controlled by the dynamic gain control 420. The analog gain 460 is minimized while the digital gain is maximized through the gain 445 in order to maintain a user supplied gain setting through the I2C gain 403. As mentioned above, the use of I2C for controlling the gain is not intended to be limiting in any way.

Figure 5:
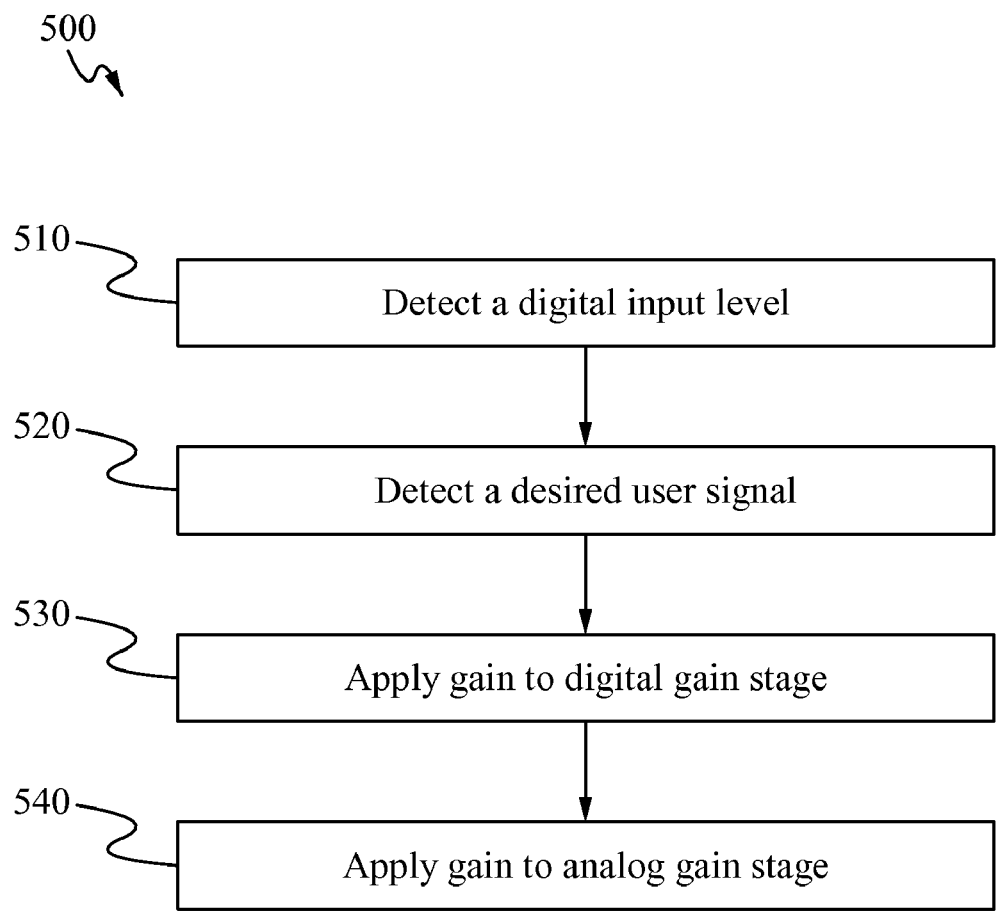
FIG. 5 shows a method of maximizing DR in a digital to analog signal path.

FIG. 5 shows a method for optimizing dynamic range in a digital to analog signal path. In a step 510, a digital input level is detected. As discussed above, the digital input level can be an RMS level, a peak level, or any other convenient level. In a step 520, a user gain setting is detected. The user gain setting sets an overall gain, or in the case of audio, volume for a digital to analog signal path. The user gain setting can be hardwired into a system, such as an RF receiver or modem, or controllable by an end user, such as with an mp3 player. Preferably, the steps 510 and 520 are performed concurrently. In a step 530, an early path digital gain setting in a digital gain stage is maximized according to the digital input level and the user gain setting. Preferably, the digital gain stage is clip limited so as not to overflow any registers in the digital gain stage. In some embodiments, the digital gain setting is maximized by altering the loop gain of a feedback loop of a digital to analog converter. In a step 540, a late path analog gain is minimized while maintaining the user gain setting. Preferably, the steps 530 and 540 are performed concurrently. The steps 510-540 are performed continuously. In sum, low level signals experience high gain in the digital realm, where the higher signal level early in the signal path provides an improved signal to noise ratio from noise contributions later in the path. Therefore, less analog gain is needed to achieve the same overall desired gain of the digital to analog signal path. Low level signals are reproduced with greater fidelity, and as a result, there is a greater overall range of signal levels for the digital to analog signal path, significantly increasing DR.

In operation, what is provided is a circuit and a method for maximizing, or optimizing the DR of a digital to analog signal path with negligible cost. As the person of ordinary skill having the benefit of this disclosure will recognize, the addition of a dynamic gain controller and a level detector incurs minimal power consumption and are on a semiconductor die. In contrast, prior art solutions relied on a high end DAC or analog gain and gain modules requiring great increases in current and semiconductor die size to reproduce low level signals, adding unacceptable cost in an industry where fractions of cents make a difference between success and failure in the marketplace. The present invention has been described in terms of specific embodiments incorporating details to facilitate the understanding of the principles of construction and operation of the invention. The specific configurations shown and the methodologies described in relation to the various modules and the interconnections there between are for exemplary purposes only. Such reference herein to specific embodiments and details thereof is not intended to limit the scope of the claims appended hereto. For example, ΣΔ DACs have been described in detail. However, the person of ordinary skill in the art having the benefit of this disclosure will readily appreciate that several types of DACs can be utilized, each having various ways to manipulate a digital gain. Furthermore, although the analog gain or volume has been shown as a discrete output module, it is also well known that some DACs comprise integrated analog outputs having gain settings that can be manipulated. Also, digital to analog audio playback paths have been discussed. However, the circuits and methods described above will be useful for any circuit or system having a digital to analog signal path where dynamic range is of concern, such as RF receivers, modems, and the like. Also, it will be appreciated that the digital to analog signal paths 200, 300 and 400 of FIGS. 2, 3 and 4 respectively are highly simplified to show their bare minimum components. Other components can be implemented within the signal paths as applications require, such as mixers, additional gain stages, digital signal processing, or any other useful known or application specific modules. Alternatively, one DAC can be coupled to multiple analog gain stages, each stage separately controlled by a dynamic gain controller. It will be further apparent to those skilled in the art having the benefit of this disclosure that modifications may be made in the embodiment chosen for illustration without departing from the spirit and scope of the invention.

What is claimed is:

1. A circuit for maximizing dynamic range in a digital to analog signal path comprising:
   an input for receiving an input signal;
   a first gain stage coupled to the input, the first gain stage having a first gain setting;
   a second gain stage coupled to the first gain stage, the second gain stage having a second gain setting;
   a controller to dynamically select the first gain setting to maximize the first gain setting without clipping the input signal and to select the second gain setting to achieve a desired signal path gain; and
   an output coupled to the second gain stage for transmitting an output signal having the desired signal path gain,
   wherein the second gain stage comprises an analog gain stage, and the second gain setting comprises an analog gain setting.

2. The circuit of claim 1 wherein the first gain stage comprises a digital gain stage, and the first gain setting comprises a digital gain setting.

3. The circuit of claim 2 wherein the first gain stage comprises a sigma delta digital-analog converter, and the digital gain setting comprises a feedback gain change of the sigma delta digital-analog converter.

4. The circuit of claim 1 wherein the first gain stage comprises a digital gain stage configured to adjust the first gain setting by modifying a feedback value.

5. The circuit of claim 1 further comprising a zero cross detector to update the first and second gain settings when the input signal is near zero.

6. The circuit of claim 1 further comprising an input signal detector for detecting a level of the input signal.

7. The circuit of claim 6 wherein the input signal detector comprises an RMS level detector.

8. The circuit of claim 6 wherein the input signal detector comprises a peak level detector.

9. The circuit of claim 6 wherein the input signal detector comprises an average level detector.

10. The circuit of claim 1 further comprising a user gain control.

11. The circuit of claim 10 wherein the user gain control is coupled to the controller.

12. The circuit of claim 11 wherein the controller is further configured to adjust the first gain setting, the second gain setting, or both the first gain setting and the second gain setting according to the user gain control.

13. The circuit of claim 1 where the controller is configured to delay application of the second gain setting relative to application of the first gain setting to compensate for signal path delays between the first gain stage and the second gain stage.

14. The circuit of claim 1 where the controller is further configured to adjust the first gain setting and the second gain setting only if a level of the input signal is less than a predetermined threshold value for a predetermined period of time.

15. A method for maximizing dynamic range in a digital to analog signal path comprising:
    detecting a digital input signal level;
    detecting a desired user gain level;
    applying a first gain to the digital input signal;
    converting the digital input signal into an analog signal; and
    applying a second gain to the analog signal,
    wherein the first gain and the second gain are selectively and inversely manipulated according to the digital input signal while maintaining the desired user gain level.

16. The method of claim 15 further comprising updating the first gain and the second gain when the input signal is near zero.

17. The method of claim 15 wherein applying the first gain comprises changing a gain setting of a feedback loop in a sigma delta digital to analog converter.

18. In an integrated circuit, a digital to analog signal path comprising:
    an input for receiving a digital input signal;
    an input for receiving a desired signal path gain level;
    a digital gain stage for manipulating a digital gain level of the digital input signal;
    a digital to analog converter coupled to the digital gain stage for converting the manipulated digital input signal to an analog signal having an analog gain level;
    an analog gain stage for manipulating the analog gain level of the analog signal; and
    a dynamic gain controller for selectively maximizing the digital gain level and minimizing the analog gain level according to the digital gain level and while maintaining the desired signal path gain level.

19. In an integrated circuit, a digital to analog signal path comprising:
   an input for receiving a digital input signal;
   an input for receiving a desired signal path gain level;
   a digital to analog converter coupled to a digital gain stage for converting the digital input signal to an analog signal having an analog gain level, the digital to analog converter comprising a digital gain level;
   an analog gain stage for manipulating the analog gain level of the analog signal; and
   a dynamic gain controller for selectively maximizing the digital gain level and minimizing the analog gain level according to the digital gain level and while maintaining the desired signal path gain level.

20. A circuit for maximizing dynamic range in a digital to analog signal path comprising:
   an input for receiving an input signal;
   a first gain stage coupled to the input, the first gain stage having a first gain setting;
   a second gain stage coupled to the first gain stage, the second gain stage having a second gain setting;
   a controller to dynamically select the first gain setting to maximize the first gain setting without clipping the input signal and to select the second gain setting to achieve a desired signal path gain;
   an output coupled to the second gain stage for transmitting an output signal having the desired signal path gain; and
   a user gain control coupled to the controller,
   wherein the controller is further configured to adjust the first gain setting, the second gain setting, or both the first gain setting and the second gain setting according to the user gain control.

21. A circuit for maximizing dynamic range in a digital to analog signal path comprising:
   an input for receiving an input signal;
   a first gain stage coupled to the input, the first gain stage having a first gain setting;
   a second gain stage coupled to the first gain stage, the second gain stage having a second gain setting;
   a controller to dynamically select the first gain setting to maximize the first gain setting without clipping the input signal and to select the second gain setting to achieve a desired signal path gain; and
   an output coupled to the second gain stage for transmitting an output signal having the desired signal path gain,
   wherein the controller is configured to delay application of the second gain setting relative to application of the first gain setting to compensate for signal path delays between the first gain stage and the second gain stage.

22. A circuit for maximizing dynamic range in a digital to analog signal path comprising:
   an input for receiving an input signal;
   a first gain stage coupled to the input, the first gain stage having a first gain setting;
   a second gain stage coupled to the first gain stage, the second gain stage having a second gain setting;
   a controller to dynamically select the first gain setting to maximize the first gain setting without clipping the input signal and to select the second gain setting to achieve a desired signal path gain; and
   an output coupled to the second gain stage for transmitting an output signal having the desired signal path gain,
   wherein the controller is further configured to adjust the first gain setting and the second gain setting only if a level of the input signal is less than a predetermined threshold value for a predetermined period of time.

* * * * *

UNITED STATES PATENT AND TRADEMARK OFFICE
CERTIFICATE OF CORRECTION

| | | |
|---|---|---|
| PATENT NO. | : 8,362,936 B2 | Page 1 of 1 |
| APPLICATION NO. | : 13/011784 | |
| DATED | : January 29, 2013 | |
| INVENTOR(S) | : Robert Ledzius et al. | |

It is certified that error appears in the above-identified patent and that said Letters Patent is hereby corrected as shown below:

Title Page,
[57] Abstract, Line 4          Delete "an" and insert --a--
Title Page,
[57] Abstract, Line 5          Delete "an" and insert --a--

In the Specifications:
Column 2, Line 51              Delete "audio" and insert --analog--
Column 4, Line 39              Delete "haven" and insert --have--

Signed and Sealed this
Eleventh Day of February, 2014

Michelle K. Lee
*Deputy Director of the United States Patent and Trademark Office*